United States Patent [19]
Tachikawa et al.

[11] 4,153,986
[45] May 15, 1979

[54] METHOD FOR PRODUCING COMPOSITE SUPERCONDUCTORS

[75] Inventors: Kyoji Tachikawa, Tokyo; Kikuo Itoh, Yokohama, both of Japan

[73] Assignee: National Research Institute for Metals, Japan

[21] Appl. No.: 798,015

[22] Filed: May 18, 1977

Related U.S. Application Data

[62] Division of Ser. No. 613,274, Sep. 15, 1975, Pat. No. 4,094,059.

[30] Foreign Application Priority Data

Sep. 18, 1974 [JP]  Japan ................................ 49-106631

[51] Int. Cl.² ...................... H01V 11/00; B21C 23/22; H01L 39/14
[52] U.S. Cl. ................................. 29/599; 148/11.5 R
[58] Field of Search ........................................... 29/599

[56] References Cited

U.S. PATENT DOCUMENTS

| | | | |
|---|---|---|---|
| 3,868,768 | 3/1975 | Meyer | 29/599 |
| 3,874,074 | 4/1975 | Meyer | 29/599 |

*Primary Examiner*—C. W. Lanham
*Assistant Examiner*—V. K. Rising
*Attorney, Agent, or Firm*—Fitzpatrick, Cella, Harper & Scinto

[57] ABSTRACT

A superconductor including $V_3Ga$ is produced by making a composite of a vanadium core metal, a continuous portion of aluminum surrounding the vandium core metal or forming a second core, and a copper, silver or copper-silver alloy containing gallium, fabricating the composite to the desired shape, and heat-treating the shaped composite. The vanadium core may contain titanium, zirconium or hafnium, and the continuous portion of aluminum may contain copper or zirconium.

21 Claims, 7 Drawing Figures

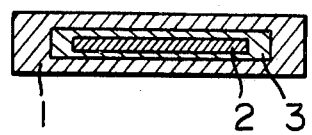
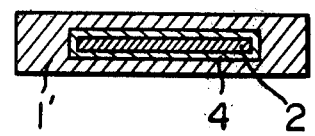
Fig. 1-a    Fig. 1-b
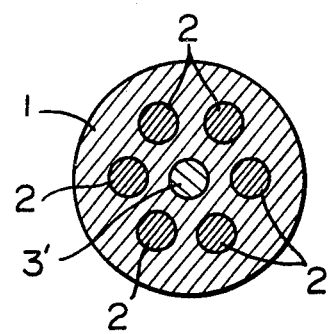
Fig. 4
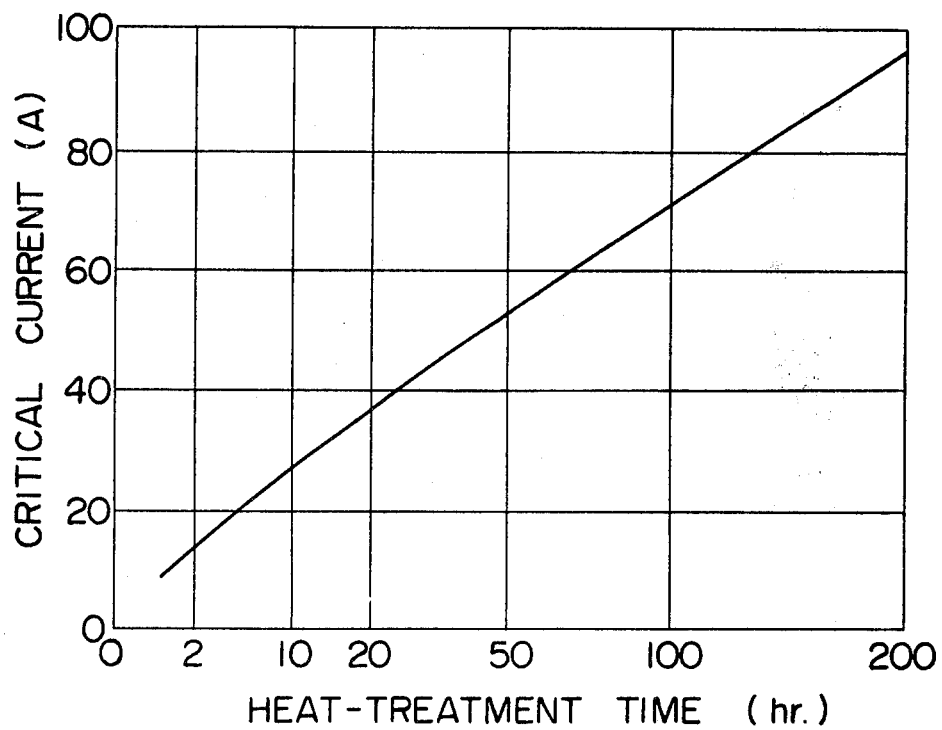
Fig. 3

Fig. 2-a
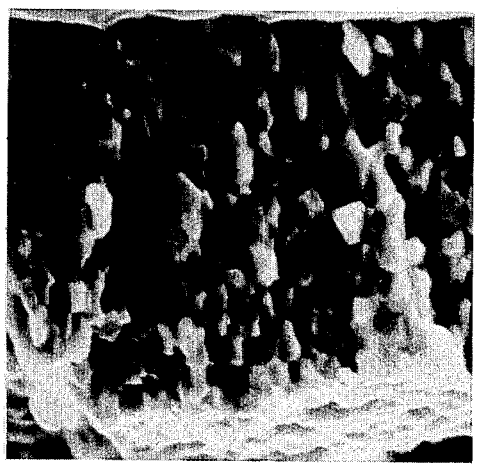
Fig. 2-b
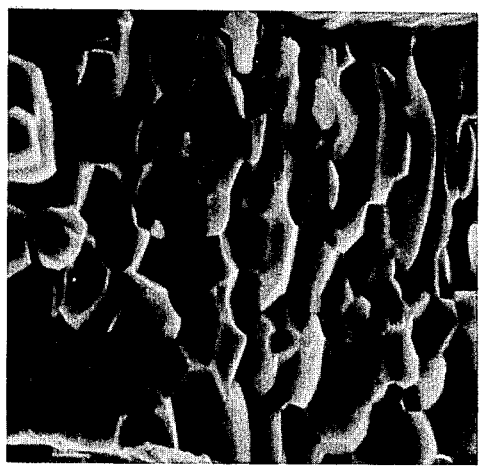

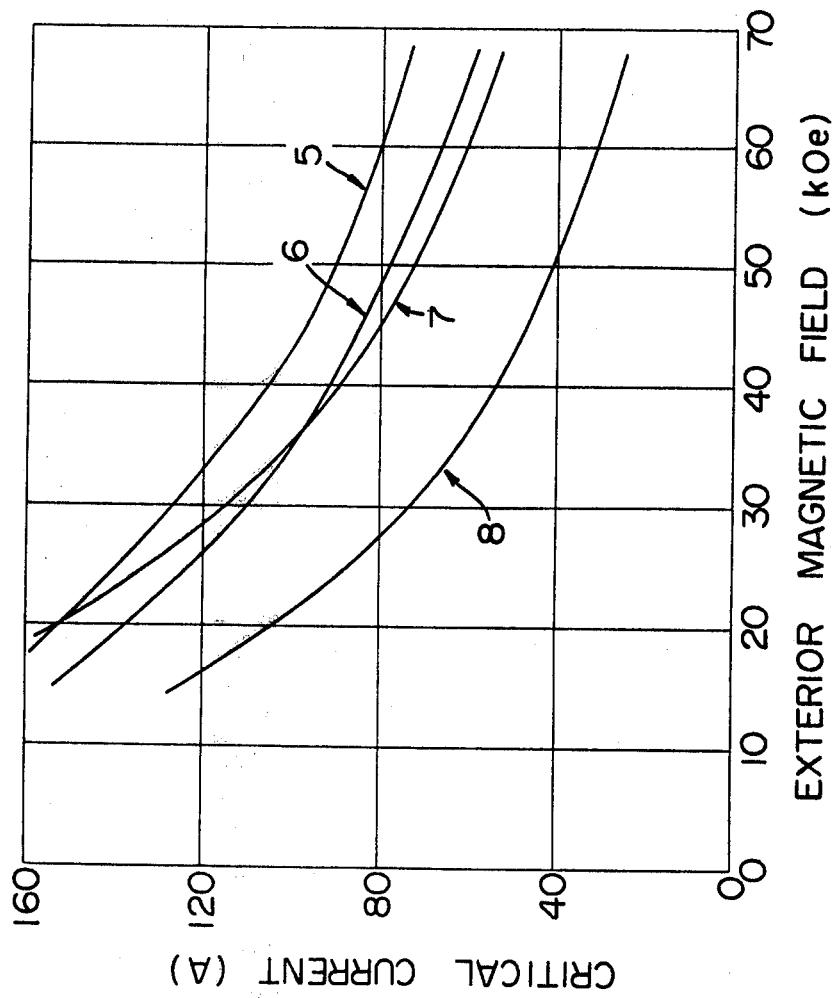

METHOD FOR PRODUCING COMPOSITE SUPERCONDUCTORS

This is a division of application Ser. No. 613,274 filed Sept. 15, 1975, now U.S. Pat. No. 4,094,059.

This invention relates to a superconductor and a method for producing the superconductor, and more specifically, to a superconductor including $V_3Ga$ and a method for producing the superconductor.

Most superconductors now in use are as magnet wires capable of generating an intensive DC magnetic field without consuming electric power. Among the superconductors are an alloy wire which can be easily subjected to plastic deformation and a compound wire which is brittle and cannot be subjected to plastic deformation. An alloy of niobium and zirconium and an alloy of niobium and titanium are known as typical examples of the former, and are used after being drawn out to wires of about 0.25 mm in diameter. Typical examples of the latter include $Nb_3Sn$ and $V_3Ga$ having a $\beta$-W type crystal structure. In general, compound wire materials are better than alloy wire materials in superconducting properties, but the compound wires lack workability. The production of compound superconductor wires therefore requires special contrivances.

The after $V_3Ga$ has a high critical magnetic field exceeding 200 K0e at 4.2° K., and therefore, possesses extremely good properties as superconducting magnet wires for generating an intensive magnetic field The prior art of manufacturing superconductors of $V_3Ga$ already suggested a method which comprises making a composite consisting of a sheath portion of a gallium-containing alloy in which gallium is included in copper, silver or a copper-silver alloy and a core portion of vanadium or a vanadium alloy, fabricating it into a desired shape such as a wire, tape or pipe by wire drawing, rolling or pipe drawing, and heat-treating the fabricated composite to form a $V_3Ga$ layer near the interface between the gallium-containing alloy and the vanadium metal (U.S. Pat. No. 3,857,173). We call this technique a composite processing method.

In the manufacture of $V_3Ga$ superconductors by the composite processing method, superconductors of better superconducting characteristics can be obtained when the gallium content of the gallium-containing alloy is higher. However, the higher the gallium content is, the higher is the hardness of the gallium-containing alloy, and it becomes increasingly difficult to fabricate the composite into various shapes such as wires, tapes or pipes. For example, the number of steps in the manufacturing process increases because rolling-annealing stages required to roll the composite to the desired size must be increased greatly. Furthermore, since gallium is an expensive metal, the product becomes expensive when the gallium content is increased. From the viewpoint of processability and economy, therefore, the gallium content of the gallium-containing alloy is desired to be low.

Accordingly, it is an object of this invention to provide an improved method for processing composites by which a $V_3Ga$ superconductor having good super-conducting characteristics can be made from a gallium-containing alloy having a low content of gallium.

It has now been found that when in the composite processing method, a continuous portion of aluminum or its alloy is placed in a sheath consisting of a gallium-containing alloy, and the composite is heat-treated, the formation of $V_3Ga$ is promoted by the intermediary of aluminum, and consequently, the above object of this invention can be achieved.

According to this invention, a superconductor containing $V_3Ga$ can be produced by an improved method which comprises making a composite composed of a sheath portion of a gallium-containing alloy selected from the group consisting of copper-gallium alloy, silver-gallium alloy and copper-silver-gallium alloy each containing 5 to 25 atomic percent of gallium and surrounded by the sheath portion, at least one core portion of a vanadium metal selected from the group consisting of vanadium and vanadium alloys containing 0.1 to 10 atomic percent of titanium, zirconium or hafnium, the composite having a continuous portion of aluminum or an aluminum alloy which is present in contact with the core so as to surround the core of the vanadium metal in the sheath alloy, or is present as at least one core independent from the vanadium metal; elongating the composite; and heat-treating the elongated composite thereby to form a $V_3Ga$ layer between the sheath portion and the core portion.

According to another aspect of this invention, there is provided a superconductor comprising a vanadium core, a $V_3Ga$ layer overlaying the vanadium core and a Cu-Ga-Al alloy layer containing less than 25 atomic percent gallium overlaying the $V_3Ga$ layer. If desired, the vanadium core may be omitted and the $V_3Ga$ becomes the core.

FIG. 1-a is a sectional view showing one embodiment of a rolled tape-like composite in accordance with this invention;

FIG. 1-b is a sectional view showing a super-conductor obtained by heat-treating the composite shown in FIG. 1-a;

FIG. 2-a is a scanning electron microphotograph of the $V_3Ga$ layer of a superconductor in accordance with this invention;

FIG. 2-b is a scanning electron microphotograph of the $V_3Ga$ layer of a superconductor as a control;

FIG. 3 is a graphic representation showing the relationship between the critical current and the heat-treating time for a superconductor of this invention;

FIG. 4 is a sectional view showing one embodiment of a composite multi-core wire of a superconductor of this invention; and FIG. 5 is a graphic representation showing the relation between the intensity of the applied magnetic field and the critical current of superconductors of this invention and a control.

According to the present invention, a superconductor of $V_3Ga$ is produced by making a composite comprising copper, silver or a copper-silver alloy containing 0.1 to 25 atomic percent of gallium, a core metal, i.e., vanadium or a vanadium alloy containing 0.1 to 10 atomic percent of titanium, zirconium or hafnium and aluminum, an aluminum-copper alloy or an aluminum-zirconium alloy surrounding and contacting the core metal or forming a separate core portion; and fabricating the resulting composite to a desired configuration. For example, the composite is fabricated into wires, tapes or pipes by wire drawing, rolling or pipe drawing, respectively. The composite so fabricated in the desired shape is then heat-treated to make the gallium diffuse selectively from the alloy composed of copper, silver or copper-silver and gallium into the core metal to produce a continuous layer of $V_3Ga$ between the core metal and the copper, silver or copper-silver alloy containing a small amount of residual gallium. As a result of the heat-treatment, aluminum or its alloy diffuses into the gallium-containing alloy as $V_3Ga$ is formed.

It is not necessary to leave an unreacted vanadium core after the heat-treatment. Copper, silver or aluminum is not diffused into the $V_3Ga$ compound so as not to deteriorate the intrinsic superconducting characteristics of $V_3Ga$.

According to the improvement of this invention, a continuous portion consisting of aluminum or an aluminum alloy is caused to be present in the composite. The formation of $V_3Ga$ is promoted by the intermediary of the aluminum metal, and therefore, even when a gallium-containing alloy having a low gallium content is used, superconductors having good superconductivity comparable or superior to the case of using a gallium alloy having a high gallium content can be obtained. This renders the resulting composite extremely easy to fabricate and moreover, decreases the material cost.

As a result of causing the continuous portion of aluminum metal to be present in the composite, the temperature for heat-treating the composite to form $V_3Ga$ can be lowered as compared with the case of not causing it to be present. This reduces the crystal grain size of $V_3Ga$, and increases its critical current.

Since $V_3Ga$ superconductors having improved superconducting critical currents can be obtained by the improved method of this invention, there is an advantage that magnets of small sizes can be produced from the super-conductors using a small-sized cooling device.

Pure aluminum or aluminum alloys can equally be used. However, aluminum alloys having the same processability as the gallium-containing alloy, such as an aluminum-copper alloy containing 0.1 to 8.0 atomic percent, preferably 1.0 to 4.0 atomic percent, of copper, and an aluminum-zirconium alloy containing 0.1 to 2.0 atomic percent, perferably 0.5 to 1.0 atomic percent, of zirconium are preferred. The use of such aluminum alloys renders the processing of the composite easier, and brings about better characteristics of the resulting superconductors.

The aluminum or its alloy is contained in a proportion of preferably 0.1 to 30%, more preferably 0.5 to 15%, in terms of its area in the total area of the cross-section of the elongated composite. If the proportion is less than 0.1%, there is no effect of the presence of aluminum. On the other hand, when it exceeds 30%, the formation of $V_3Ga$ is impeded, and the superconducting characteristics are deteriorated.

According to this invention, the gallium content of the gallium-copper, gallium-silver or gallium-copper-silver alloy forming the sheath portion of the composite is 0.1 to 25 atomic percent, preferably 5 to 21 atomic percent. When the gallium content is less than 0.1 atomic percent, the super-conducting properties become poor, and when it is above 25 atomic percent, the composite becomes difficult to fabricate into thin wire or tape forms.

The gallium alloy in the sheath portion may further contain 0.1 to 10 atomic percent, preferably 1 to 4 atomic percent, of lead. The addition of lead results in the formation of superconductors having a higher critical magnetic field value and better super-conducting properties. It is not clear why such an improvement can be achieved as a result of adding lead, but presumably the addition of lead, a heavy element, will bring about an enhanced spin-orbit scattering effect which increases the critical magnetic filed.

The ratio between the vanadium metal core portion and the gallium alloy sheath portion is not critical in particular, but usually, in the cross-section of the elongated material, the cross-sectional area of the core portion accounts for 10 to 50% of the total cross-sectional area of the elongated material.

According to the present invention, the composite can be conveniently produced, for example, by a method which comprises wrapping a thin sheet of aluminum or its alloy around a cylindrical material of vanadium metal, and inserting the resulting structure in a hole provided in a block of the gallium-containing alloy; a method which comprises providing a number of holes in a block of the gallium-containing alloy, and inserting in the holes a structure formed by wrapping a thin sheet of aluminum or its alloy around a vanadium material; a method which comprises providing a number of holes in a block of the gallium-containing alloy so that one of these holes is situated in the center of the block, the other holes are disposed so as to surround the central hole and be spaced from the central hole and from one another, and inserting the aluminum or aluminum alloy in the central hole and the vanadium metal in the other holes; or a method which comprises inserting the aluminum or its alloy and the core of the vanadium metal alternately in a number of holes provided in the gallium-containing alloy.

Composite ultrafine multi-core wires can be produced by wire drawing from those composites produced by the above methods which contain many vanadium metal cores.

Instead of using the perforated block of gallium-containing alloy, there can be employed a method in which the aluminum or aluminum alloy and the vanadium or vanadium alloy are disposed in a mold in the above-mentioned arrangement, and the molten gallium-containing alloy is poured into the mold.

The resulting composite is subsequently fabricated into wires, tapes or pipes, etc. by wire drawing, rolling or pipe drawing, etc. Following this, the product is heat-treated at a temperature ranging from 450° to 950° C., preferably from 550° to 750° C. for a period of 5 minutes to 500 hours, preferably 60 minutes to 500 hours to make the gallium selectively diffuse from the alloy into the core vanadium metal and to form a $V_3Ga$ layer on the core metal. The heating temperature and time are determined according to the thickness and gallium content of the alloy. As a result of the heat-treatment, a metallic layer consisting mainly of copper-aluminum, silver-aluminum or copper-silver-aluminum alloy which serves as a layer for stabilizing the superconductivity is also formed on the surface of the $V_3Ga$ superconductor.

When the heat-treating temperature is lower than 450° C., $V_3Ga$ is not formed, and when it is higher than 950° C., cyrstalline $V_3Ga$ grains become coarse to cause the deterioration of the critical current.

By the method of this invention, a conductor including lots of this $V_3Ga$ superconductive filaments embedded in Cu-Ga alloy matrix can be easily fabricated. For example, a composite composed of Cu-Ga alloy and a number of vanadium or vanadumum alloy cores is fabricated into a thin wire and then heat-treated to produce a superconductor including many thin filamentary $V_3Ga$.

The $V_3Ga$ superconductors in accordance with this invention can be used as superconducting magnets for generating a high magnetic field. Since $V_3Ga$ superconducting magnets using composite ultrafine multi-core filaments produced from a composite having a number of vanadium cores can operate very stably in a rapidly changing magnetic field, they can be used for various electrical machines such as generators and motors and for large-sized magnetic apparatuses such as synchrotrons, magnetically lifted vehicles, MHD power generators and nuclear fusion reactors.

It can be expected that multi-filamentary $V_3Ga$ superconductors produced by the method of this invention are not only suitable for DC applications but also for AC applications. In the case of AC applications, it is desirable that the matrix around the superconductive filaments has a relatively high electrical resistivity for decoupling each super-conductive filament electrically and reducing the AC loss. In the case of the present invention, the resistivity of the Cu-Ga-Al alloy matrix is high enough to meet these demands. The Cu-Ga-Al alloy matrix should also be effective for mechanical reinforcement of the superconductor.

The following Examples further illustrate the present invention.

EXAMPLE 1

(a) A Cu-Ga alloy having a gallium content of 15 atomic percent was melted in a graphite crucible to cast a rod having a diameter of 15 mm and a length of 100 mm. The surface of the rod was machined on a lathe to a diameter of 12 mm, and then a drill hole 5.6 mm in diameter was provided to form a pipe. Then, an aluminum pipe 0.5 mm in thickness was wrapped around a vanadium rod having a diameter of 4.5 mm, and the resulting structure was inserted in the gallium alloy pipe, and the resulting composite was subjected to rolling and intermediate annealing in four stages to form a tape having a width of 5.5 mm and a thickness of 0.18 mm. The cross-section of this tape is shown schematically in FIG. 1-a. In FIG. 1-a, the reference numeral 1 represents a sheath portion of the copper-gallium alloy; 2, the vanadium core; and 3, aluminum overlaid on the vanadium core. A test tape, 30 mm in length, was cut out from the resulting tape, and heat-treated in an argon atmosphere at 650° C. for 100 hours to form a $V_3Ga$ layer. The cross-section of this tape after heat-treatment is shown schematically in FIG. 1-b. In FIG. 1-b, the reference numeral 1' represents a copper-gallium-aluminum alloy in which aluminum was diffused in the sheath portion of the copper-gallium alloy; 2, the vanadium core; and 4, the resulting $V_3Ga$ layer.

As a result of the above heat-treatment, a $V_3Ga$ layer about 4.0 μm in thickness was formed around the vanadium metal. This $V_3Ga$ type had a super-conducting critical temperature of 14.5° K. Its superconducting critical current, measured at the temperature of liquid belium in an exterior perpendicular magnetic field of 65 KOe was 70A.

(b) A $V_3Ga$ superconductor was produced in the same way as described in paragraph (a) above except that the diameter of the hole to be provided in the gallium-containing alloy was changed to 4.6 mm, and a vanadium rod 4.5 mm in diameter was used instead of the aluminum pipe-clad vanadium rod. The thickness of the resulting $V_3Ga$ layer was about 1.6 μm, and the critical current of the resulting superconductor, as measured under the same conditions as above, was 28A.

(c) A $V_3Ga$ superconductor was produced by varying the heat-treating conditions described in paragraph (b) so as to form a $V_3Ga$ layer having a thickness of 4 μm. The heat-treating conditions thus used were a temperature of 700° C. and a period of 100 hours.

Scanning-type electron microphotographs of the $V_3Ga$ layers obtained in paragraphs (a) and (c) above are shown in FIGS. 2-a and 2-b. The scale shown at the bottom of FIG. 2-a and FIG. 2-b corresponds to 1 micron. It can be seen from these Figures that the average crystal grain size of the structure in FIG. 2-b is about twice that in FIG. 2-a.

From the data in paragraphs (a), (b) and (c) and the observation of the metal structures, it is seen that the aluminum metal diffused in the gallium-containing alloy promotes the formation of $V_3Ga$ and permits the formation of a thick $V_3Ga$ layer without the coarsening of $V_3Ga$ crystal grains, and the critical current can be markedly increased.

(d) In the method described in paragraph (a) to form a $V_3Ga$ superconductor, the heat-treating time at 650° C. was varied. The critical currents of the resulting superconductors were measured under the same conditions, and the heat-treatment time-critical current characteristic curves shown in FIG. 3 were obtained.

EXAMPLE 2

(a) A rolled sample tape was prepared in the same way as in paragraph (a) of Example 1 except that a Cu-Ga alloy having a gallium content of 18 atomic percent was used. The sample was heat-treated in an argon atmosphere at 550° C. for 100 hours.

The thickness of the $V_3Ga$ layer formed in this sample was about 5.0 μm, and the critical current of the resulting superconductor measured under the same conditions as in Example 1 was 100 A.

(b) A rolled sample tape was produced in the same way as in paragraph (a) above except that a vanadium rod not clad with an aluminum pipe was used.

Using this sample tape, a superconductor having the same critical current characteristics as above was produced. This required heat-treatment at 625° C. for about 100 hours.

From the above results, it is clear that the aluminum metal has an effect of promoting the formation of $V_3Ga$, and far lower heat-treating temperatures can be used than in the case of not using aluminum metal.

EXAMPLE 3

(a) A copper-gallium alloy having a gallium content of 13 atomic percent was cast to form a rod 20 mm in diameter and 100 mm in length. Seven holes each with a diameter of 3 mm were provided in this rod by means of a drill. A rod of a copper-aluminum alloy containing 2 atomic percent of copper was inserted in the central hole, and a vanadium rod was inserted in each of the surrounding six holes. The cross-section of the composite is shown schematically in FIG. 4. Referring to FIG. 4, the resulting composite has a cross-section which comprises the copper-gallium alloy rod or sheath portion 1 surrounding the separate copper-aluminum rod or core portion 3' and the several vanadium rods or core portions 2. As illustrated, the sheath portion 1 completely surrounds each of the core portions 2 and 3', and each of the core portions 2 and 3' are separated from each other by the copper-gallium alloy of the sheath portion 1. The composite was fabricated into multi-core filament wire having a diameter of 0.30 mm by grooved rolling and intermediate annealing in four stages and subsequent wire drawing. The filaments obtained were heat-treated at 650° C. for 100 hours to form a superconductor. The thickness of the $V_3Ga$ layer formed in this superconductor was about 3 μm. The critical current of this superconductor was 20A in a magnetic filed of 65 KOe.

(b) A superconductor was produced in the same manner as in paragraph (a) above except that vanadium rods were inserted in all of the holes.

The thickness of the $V_3Ga$ layer of this superconductor was about 0.6 μm, and its critical current under the same conditions as above was 4A.

(c) A $V_3Ga$ superconductor was prepared by the same procedure as in paragraph (b) above except that the gallium content of the copper-gallium alloy was changed so that the resulting superconductor had the same critical current characteristics as in paragraph (a) above. To achieve this end, it was necessary for the copper-gallium alloy to have a gallium content of 19 atomic percent. In order to fabricate the copper-gallium alloy having a gallium content of 19 atomic percent from a diameter of 20 mm to 0.3 mm, grooved rolling, drawing and intermediate annealing in 16 stages were required.

EXAMPLE 4

(a) A superconductor was produced in the same way as in paragraph (a) of Example 1 except that a silver-gallium alloy containing 15 atomic percent of gallium was used instead of the copper-gallium alloy.

The thickness of the $V_3Ga$ layer formed in this superconductor was about 3.3 μm. Its critical current, measured at the temperature of liquid helium in a magnetic field of 65 KOe, was 55A.

(b) A superconductor was produced in the same was as in paragraph (a) above except that a vanadium rod with a diameter of 5 mm not clad with an aluminum pipe was used. The thickness of the $V_3Ga$ layer formed in this superconductor was about 1.5 μm. Its critical current, measured at the temperature of liquid helium in a magnetic field of 65 KOe, was 25A.

EXAMPLE 5

(a) A Cu-Ag-Ga alloy containing 35 atomic percent of silver and 13 atomic percent of gallium was cast into a rod having a diameter of 20 mm and length of 100 mm. Seven holes each having a diameter of 3 mm were provided in the rod in the same arrangement as shown in FIG. 4 using a drill. A rod of an aluminum alloy containing 0.5 atomic percent of zirconium was inserted in each of the surrounding six holes. The resulting composite was then fabricated into a multi-core filament wire having a diameter of 0.30 mm by grooved rolling and intermediate annealing in four stages and subsequent wire drawing, and then heat-treated at 625° C. for 100 hours to produce a superconductor. The thickness of the $V_3Ga$ layer formed in this super-conductor was about 2.6 μm, and its critical current, measured at the temperature of liquid helium in a magnetic field of 65 KOe, was 18 A.

(b) A superconductor was produced in the same way as in paragraph (a) above except that vanadium rods were inserted in all of the holes. The thickness of the $V_3Ga$ layer formed in this superconductor was about 0.6 μm, and its critical current was 4A.

EXAMPLE 6

Three superconductor samples were produced in the same way as in Example 1 using three kinds of vanadium alloys instead of the pure vanadium rod. The compositions of the vanadium alloys used were as follows:

Sample A: containing 0.2% zirconium
Sample B: containing 0.3% of titanium
Sample C: containing 0.25 of hafnium The thickness of the $V_3Ga$ layer formed in these superconductors was 4.0 μm for sample A, 4.5 μm for sample B, and 3.2 μm for sample C.

The variations in critical current of the above samples at the temperatures of liquid helium in a magnetic field of various intensities are shown in FIG. 5 as magnetic field intensity-critical current curves. For comparison, the varying current values of a sample produced by using pure vanadium not clad with an aluminum pipe are also shown in FIG. 5.

In FIG. 5, the curves 5, 6, 7, and 8 are magnetic field intensity-critical current curves of sample A, sample B, sample C, and the sample obtained in paragraph (b) of Example 1, respectively.

EXAMPLE 7

A superconductor was prepared in the same way as in paragraph (a) of Example 1 except that a Cu-Ga alloy containing 15 atomic percent of gallium and also 2 atomic percent of lead was used.

The thickness of the $V_3Ga$ layer formed in this superconductor was about 4.0 μm, and its critical current measured under the same conditions as in Example 1 was 110 A.

The critical magnetic field value of this superconductor at 4.2° K. was 215 KOe. In contrast, the superconductor obtained in paragraph (a) in Example 1 had a critical magnetic field value of 205 KOe at 4.2° K. This comparative study shows that the critical magnetic field can be increased by including lead in a Cu-Ga alloy.

What we claim is:

1. In a method for producing $V_3Ga$ super-conductors which comprises forming a composite of at least one core portion and a sheath portion, said composite having a cross-section wherein said sheath portion completely surrounds said core portion, said sheath portion being composed of a gallium-containing alloy selected from the group consisting of copper-gallium, silver-gallium, and copper-silver-gallium alloys, and said core portion being composed of a vanadium metal selected from the group consisting of vanadium and vanadium alloys containing from 0.1 to 10 atomic percent of titanium, zirconium or hafnium; longitudinally elongating said composite; and heat treating the resulting elongated composite to form a $V_3Ga$ layer at the interface of said sheath and core portions; the improvement comprising including a longitudinally-continuous portion of a member selected from the group consisting of aluminum and an aluminum alloy in said composite prior to elongating the same, wherein said longitudinally-continuous portion of aluminum or aluminum alloy is present in the cross-section of said sheath portion as at least one additional core portion distinct from said vanadium metal core portion and separated therefrom by the gallium-containing alloy of said sheath portion, and wherein said aluminum or aluminum alloy diffuses into said sheath portion by said heat treatment and promotes the formation of said $V_3Ga$ layer.

2. The method of claim 6 wherein the gallium-containing alloy in the sheath portion further contains from 0.1 to 10 atomic percent of lead.

3. The method of claim 1 wherein the aluminum alloy is selected from the group consisting of an aluminum-copper alloy and an aluminum-zirconium alloy.

4. The method of claim 1 wherein the heat-treatment is carried out at a temperature of from 450° to 950° C.

5. The method of claim 4 wherein the heat-treatment is carried out for a period of time of from 5 minutes to 500 hours.

6. The method of claim 1 wherein said gallium-containing alloy contains from 5 to 25 atomic percent of gallium.

7. The method of claim 3 wherein said aluminum-copper alloy contains from 0.1 to 8 atomic percent of copper.

8. The method of claim 3 wherein said aluminum-copper alloy contains from 1 to 4 atomic percent of copper.

9. The method of claim 3 wherein said aluminum-zirconium alloy contains from 0.1 to 2 atomic percent of zirconium.

10. The method of claim 3 wherein said aluminum-zirconium alloy contains from 0.5 to 1 atomic percent of zirconium.

11. The method of claim 1 wherein the cross-sectional area of said continuous portion of aluminum or aluminum alloy is from 0.1 to 30% of the total cross-sectional area of said elongated composite.

12. The method of claim 1 wherein the cross-sectional area of said continuous portion of aluminum or aluminum alloy is from 0.5 to 15% of the total cross-sectional area of said elongated composite.

13. The method of claim 1 wherein the gallium-containing alloy contains from 5 to 21 atomic percent of gallium.

14. The method of claim 2 wherein the gallium-containing alloy in the sheath portion further contains from 1 to 4 atomic percent of lead.

15. The method of claim 1 wherein the heat-treatment is carried out at a temperature of from 550° to 750° C.

16. The method of claim 15 wherein the heat-treatment is carried out for a period of time of from 60 minutes to 500 hours.

17. The method of claim 1 wherein said gallium-containing alloy is copper-gallium, wherein said vanadium metal is vanadium and wherein said aluminum member is aluminum.

18. The method of claim 1 wherein said gallium-containing alloy is copper-gallium, wherein said vanadium metal is vanadium and wherein said aluminum member is aluminum-copper alloy.

19. The method of claim 1 wherein said gallium-containing alloy is copper-gallium, wherein said vanadium metal is vanadium and wherein said aluminum member is aluminum-zirconium alloy.

20. The method of claim 1 wherein said gallium-containing alloy is copper-gallium, wherein said vanadium metal is vanadium-zirconium alloy and wherein said aluminum member is aluminum.

21. The method of claim 1 wherein said gallium-containing alloy is copper-gallium, wherein said vanadium metal is vanadium-zirconium alloy and wherein said aluminum member is aluminum-copper alloy.

* * * * *

UNITED STATES PATENT AND TRADEMARK OFFICE
CERTIFICATE OF CORRECTION

PATENT NO. : 4,153,986
DATED : May 15, 1979
INVENTOR(S) : KYOJI TACHIKAWA, et al.

It is certified that error appears in the above-identified patent and that said Letters Patent are hereby corrected as shown below:

Col. 1, line 26, delete "after";

Col. 1, line 29, after "field" insert --.--;

Col. 7, line 33, after "same", change "was" to --way--.

Signed and Sealed this

Ninth Day of October 1979

[SEAL]

Attest:

RUTH C. MASON
Attesting Officer

LUTRELLE F. PARKER
Acting Commissioner of Patents and Trademarks